United States Patent
Kumagai

(10) Patent No.: US 7,299,443 B2
(45) Date of Patent: Nov. 20, 2007

(54) METHOD FOR DESIGNING WIRING CONNECTING SECTION AND SEMICONDUCTOR DEVICE

(75) Inventor: Kenji Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 144 days.

(21) Appl. No.: 11/305,224

(22) Filed: Dec. 19, 2005

(65) Prior Publication Data

US 2006/0097401 A1     May 11, 2006

Related U.S. Application Data

(62) Division of application No. 10/097,871, filed on Mar. 15, 2002, now Pat. No. 7,005,746.

(30) Foreign Application Priority Data

Sep. 7, 2001   (JP)   ............................. 2001-272228

(51) Int. Cl.
G06F 17/50   (2006.01)

(52) U.S. Cl. ...................................................... 716/12

(58) Field of Classification Search .................. 716/2, 716/10, 12–14

See application file for complete search history.

(56) References Cited

U.S. PATENT DOCUMENTS

| | | |
|---|---|---|
| 4,889,832 A | 12/1989 | Chatterjee |
| 5,532,516 A | 7/1996 | Pasch et al. |
| 5,691,572 A | 11/1997 | Chung |
| 5,721,453 A | 2/1998 | Imai et al. |
| 5,877,091 A | 3/1999 | Kawakami |
| 5,939,789 A | 8/1999 | Kawai et al. |
| 6,016,000 A | 1/2000 | Moslehi |
| 6,166,442 A | 12/2000 | Nakamura |
| 6,202,191 B1 | 3/2001 | Filippi et al. |
| 6,281,108 B1 | 8/2001 | Layman |
| 6,392,299 B1 | 5/2002 | Gayet |
| 6,417,572 B1 | 7/2002 | Chidambarrao et al. |
| 6,441,418 B1 | 8/2002 | Shields et al. |
| 6,441,494 B2 | 8/2002 | Huang et al. |
| 6,448,173 B1 | 9/2002 | Clevenger et al. |
| 6,528,888 B2 | 3/2003 | Cho et al. |
| 6,551,856 B1 | 4/2003 | Lee |

(Continued)

FOREIGN PATENT DOCUMENTS

JP   07-045745   2/1995

(Continued)

*Primary Examiner*—Stacy Whitmore
(74) *Attorney, Agent, or Firm*—Westerman, Hattori, Daniels & Adrian, LLP.

(57) ABSTRACT

First, an amount of a current flowing between a first wiring and a third wiring is estimated, and the number of stack vias required for connecting the first wiring and the third wiring is determined. Next, based on the number of stack vias, the number of virtual wirings for determining positions of the stack vias is determined. Thereafter, the virtual wirings are arranged in a forming region of the third wiring above the first wiring, for example, at an equal interval, and the stack vias are created in intersections of the first wiring and the virtual wirings. Thereafter, the virtual wirings are removed, and the third wiring is created. According to needs, a second wiring passing between the stack vias is created.

4 Claims, 6 Drawing Sheets

U.S. PATENT DOCUMENTS

| | | |
|---|---|---|
| 6,590,290 B1 | 7/2003 | Cronin et al. |
| 6,590,291 B2 | 7/2003 | Akagawa |
| 6,627,926 B2 | 9/2003 | Hartswick et al. |
| 6,664,639 B2 | 12/2003 | Cleeves |
| 6,664,641 B2 | 12/2003 | Ohsaki et al. |
| 2001/0027010 A1 | 10/2001 | Jang et al. |
| 2006/0248492 A1* | 11/2006 | Hetzel .................. 716/14 |

FOREIGN PATENT DOCUMENTS

| | | |
|---|---|---|
| JP | 10-321623 | 12/1998 |
| WO | WO 01/11688 A1 | 2/2001 |

\* cited by examiner

METHOD FOR DESIGNING WIRING CONNECTING SECTION AND SEMICONDUCTOR DEVICE

CROSS-REFERENCE TO RELATED APLICATIONS

This application is based upon and claims priority of Japanese Patent Applications No. 2001-272228, filed in Sep. 7, 2001, the contents being incorporated herein by reference. This application is a divisional of prior application Ser. No. 10/097,871 filed Mar. 15, 2002 now U.S. Pat. No. 7,005,746.

BACKGROUND OF THE INVENTION

1. Field of the Invention

The present invention relates to a method for designing a wiring connecting section, in which wirings in mutually different wiring layers are electrically connected one another via a plurality of stack vias, and to a semiconductor device having a wiring connecting section designed by the method for designing a wiring connecting section.

2. Description of the Prior Art

In recent years, high integration of the semiconductor device has been further accelerated, and accompanied with such acceleration, also with regard to wirings of the semiconductor device, micro-fabrication and multi-layering have been promoted. In a semiconductor device having wiring layers of a multi-layered structure, vias (stack vias) are required for electrical connection through a plurality of wiring layers.

FIG. 1 is a plan view showing a wiring part of a conventional semiconductor device having wiring layers of a multi-layered structure, FIG. 2 is a longitudinal sectional view taken along a line I-I of FIG. 1, and FIG. 3 is a transverse sectional view taken along a line II-II of FIG. 2. Note that, in FIG. 2, illustration of an insulating layer and a semiconductor substrate below and under a wiring 51A is omitted.

FIG. 1 shows four wiring layers stacked on a semiconductor substrate 50 having specified elements (cells) formed thereon, with an insulating layer 60 interposed thereamong.

Here, the four wiring layers are referred to as a first wiring layer, a second wiring layer, a third wiring layer and a fourth wiring layer in order from a wiring layer closer to the semiconductor substrate 50. In the first and third wiring layers, wirings 51A and 53A running mainly in a horizontal direction (X direction) are formed, and in the second and fourth wiring layers, wirings 52A and 54A running mainly in a vertical direction (Y direction) are formed. Widths and wiring intervals of the wirings 51A, 52A, 53A and 54A are decided according to design rules.

Wirings in the different wiring layers are electrically connected via vias 61 penetrating through the insulating layer 60 provided among the wiring layers. A size of the vias 61 is also determined according to the design rules. Note that the vias 61 are divided into the ones for connecting wirings to each other and the ones for connecting the elements (cells) formed on the semiconductor substrate 50 and the wirings.

For example, in the case of two narrow-width wirings in mutually different wiring layers, these wirings are electrically connected via one via 61. However, in the case of connecting broad-width wirings such as the wirings 54A and 51A to each other, as shown in FIGS. 2 and 3, the vias 61 having a size determined by the design rules are arranged at an interval determined by the design rules over the entire portion where the wirings 54A and 51A cross with each other. Moreover, in the case of electrical connection through the plurality of wiring layers, as shown in FIGS. 2 and 3, pads 62 are provided over the entire region where the wirings 54A and 51A cross with each other in wiring layers (the second and third wiring layers) between the wiring 54A and 51A, and the vias 61 are arranged so as to be stacked in a vertical direction with the pads 62 interposed therebetween.

In general, the widths of the wirings and the wiring patterns of the respective wiring layers, the size, the positions and the number of the vias and the like are designed by a layout CAD (Computer-Aided Design) tool for a semiconductor device. Moreover, the design rules are determined by limitations on a fabrication process, electrical specifications required for the semiconductor device and the like. Vias stacked in the vertical direction as shown in FIG. 3 are referred to as stack vias.

The inventors of the present application conceive that problems to be described below are inherent in the conventional semiconductor device having the wiring connecting section of the above-described structure.

As described above, in the conventional semiconductor device, in the case of electrically connecting the broad-width wirings to each other, a large number of stack vias are uniformly arranged over the entire region where the wirings cross with each other. Accordingly, for example, in the case of connecting the broad-width wirings 51A of the first wiring layer and the broad-width wiring 54A of the fourth wiring layer, other wirings cannot be passed through the regions where the wirings 51A and 54A cross with each other as shown in FIG. 1, and it becomes necessary to arrange the other wirings so as to be detoured around the regions. In the example shown in FIG. 1, wirings shown with arrows are arranged so as to be detoured around the intersections (wiring connecting sections) of the wirings 51A and the wiring 54A since there exist the stack vias for connecting the wirings 51A and the wiring 54A.

As described above, in the conventional semiconductor device, it is necessary to arrange the other wirings so as to be detoured around the connecting regions of the broad-width wirings; therefore, the wirings are elongated, thus causing deterioration of the electrical characteristic and lowering a degree of freedom in designing the wirings. When the degree of freedom in designing the wiring is lowered, the number of wiring layers must be further increased, thus increasing a fabrication cost and lowering fabrication yield.

SUMMARY OF THE INVENTION

An object of the present invention is to provide a method for designing a wiring connecting section, which is capable of improving a degree of freedom in designing a wiring while satisfying electrical specifications required for the wiring connecting section, and to provide a semiconductor device having a wiring connecting section designed by the method for designing a wiring connecting section.

The method for designing a wiring connecting section of the present invention is a method for designing a wiring connecting section of a first wiring and a second wiring formed in mutually different wiring layers above a semiconductor substrate, the method comprising: a step of determining the number of stack vias required for connecting the first wiring and the second wiring based on an amount of a current flowing between the first wiring and the second wiring; a step of determining the number of virtual wirings based on the number of the stack vias; a step of arranging the virtual wirings in a forming region of the second wiring above the first wiring; a step of creating the stack vias in portions where the first wiring and the plurality of the virtual wirings cross with each other; a step of deleting the virtual wirings; and a step of creating the second wiring.

In the method for designing a wiring connecting section of the present invention, first, an amount of a current flowing between the first wiring and the second wiring is estimated. For example, the amount of the current is determined by electrical specifications of elements formed on the semiconductor substrate.

Thereafter, based on the amount of the current flowing between the first wiring and the second wiring, the number of stack vias required for connecting the first wiring and the second wiring is determined. The amount of the current capable of flowing through one stack via is determined by design rules; therefore, the number of stack vias required for connecting the first wiring and the second wiring can be obtained by calculation.

Next, based on the number of stack vias, the number of virtual wirings is determined. The virtual wirings are wirings temporarily introduced for determining positions of the stack vias. In the present invention, though the stack vias are arranged in intersections of the virtual wirings and the first wiring, the number of stack vias to be arranged for one virtual wiring is determined by the width of the first wiring and the design rules.

After the number of virtual wirings is determined in the above-described process, these virtual wirings are arranged in the forming region of the second wiring above the first wiring. In this case, the virtual wirings may be arranged even at an equal interval in the forming region of the second wiring; alternatively, the virtual wirings may be arranged at the minimum interval determined by the design rules from ends of the forming region of the second wiring to form a large space in the center thereof. Alternatively, the positions of the virtual wirings may be determined in consideration of a track of the other wiring (a third wiring) passing between the stack vias. The track of the third wiring is defined by the design rules.

Next, the stack vias are created in portions where the first wiring and the virtual wirings cross with each other. In such a manner, the positions of the stack vias are determined.

Thereafter, the virtual wirings are deleted, and the second wiring is created in a specified position. Thus, the design of the connecting section between the first wiring and the second wiring is completed.

In the present invention, since the number and the position of stack vias are determined as described above, not only electrical demands in the connecting section between the first wiring and the second wiring can be satisfied, but also other wirings can be passed between the stack vias, and thus the degree of freedom in designing the wirings is enhanced to a great extent as compared with the conventional one. Thus, cost reduction due to reduction of the number of wiring layers and much higher integration of the semiconductor device can be realized.

The semiconductor device of the present invention is a semiconductor device including a semiconductor substrate and first, second and third wiring layers sequentially stacked on the semiconductor substrate with an insulating layer interposed thereamong, the semiconductor device comprising: a plurality of stack vias for electrically connecting a first wiring in the first wiring layer and a third wiring in the third wiring layer, the stack vias being arranged in an intersection of the first wiring and the third wiring; and a second wiring passing between the plurality of the stack vias, the second wiring being formed in the second wiring layer.

In the semiconductor device of the present invention, the second wiring passing among the plurality of stack vias for electrically connecting the first wiring and the third wiring is formed. In this case, the number of stack vias is required to be set based on an allowable current value per one stack via and the amount of the current flowing between the first wiring and the third wiring.

As described above, the wiring is passed between the stack vias, thus the degree of freedom in designing the wirings is increased, and cost reduction due to reduction of the number of wiring layers and much higher integration of the semiconductor device can be realized.

DESCRIPTION OF THE PREFERRED EMBODIMENTS

Hereinafter, description will be made for an embodiment of the present invention with reference to the accompanying drawings.

Figure 1:
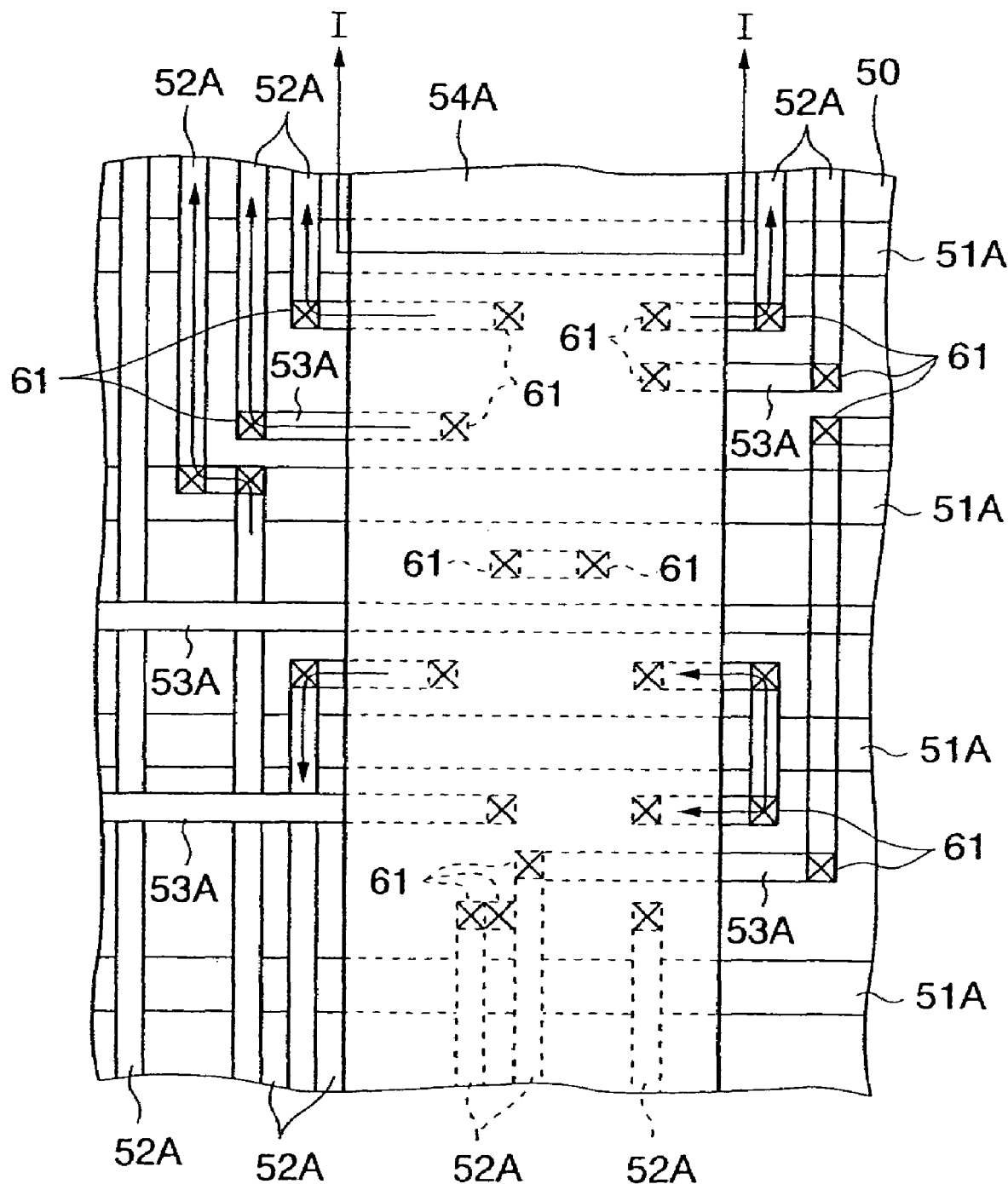
FIG. 1 is a plan view showing a wiring part of a conventional semiconductor device having wiring layers of a multi-layered structure.
Figure 2:
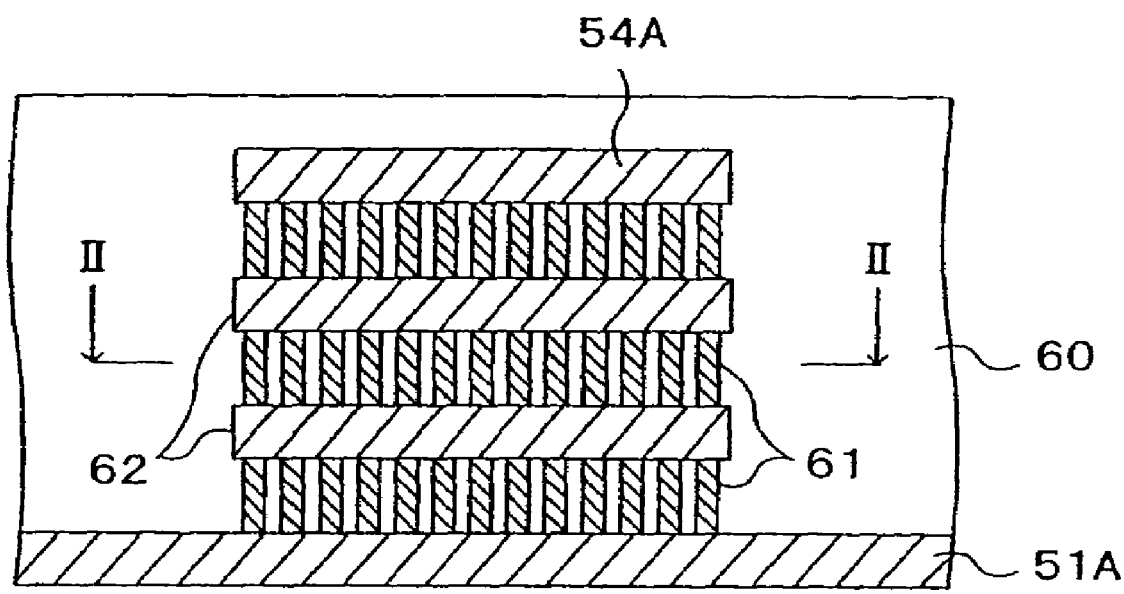
FIG. 2 is a longitudinal sectional view taken along a line I-I of FIG. 1.
Figure 3:
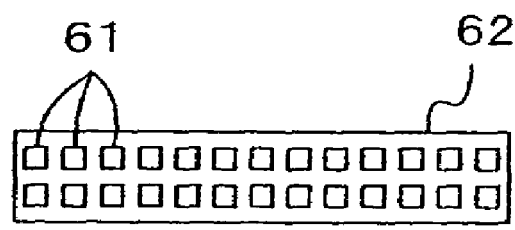
FIG. 3 is a transverse sectional view taken along a line II-II of FIG. 2.
Figure 4:
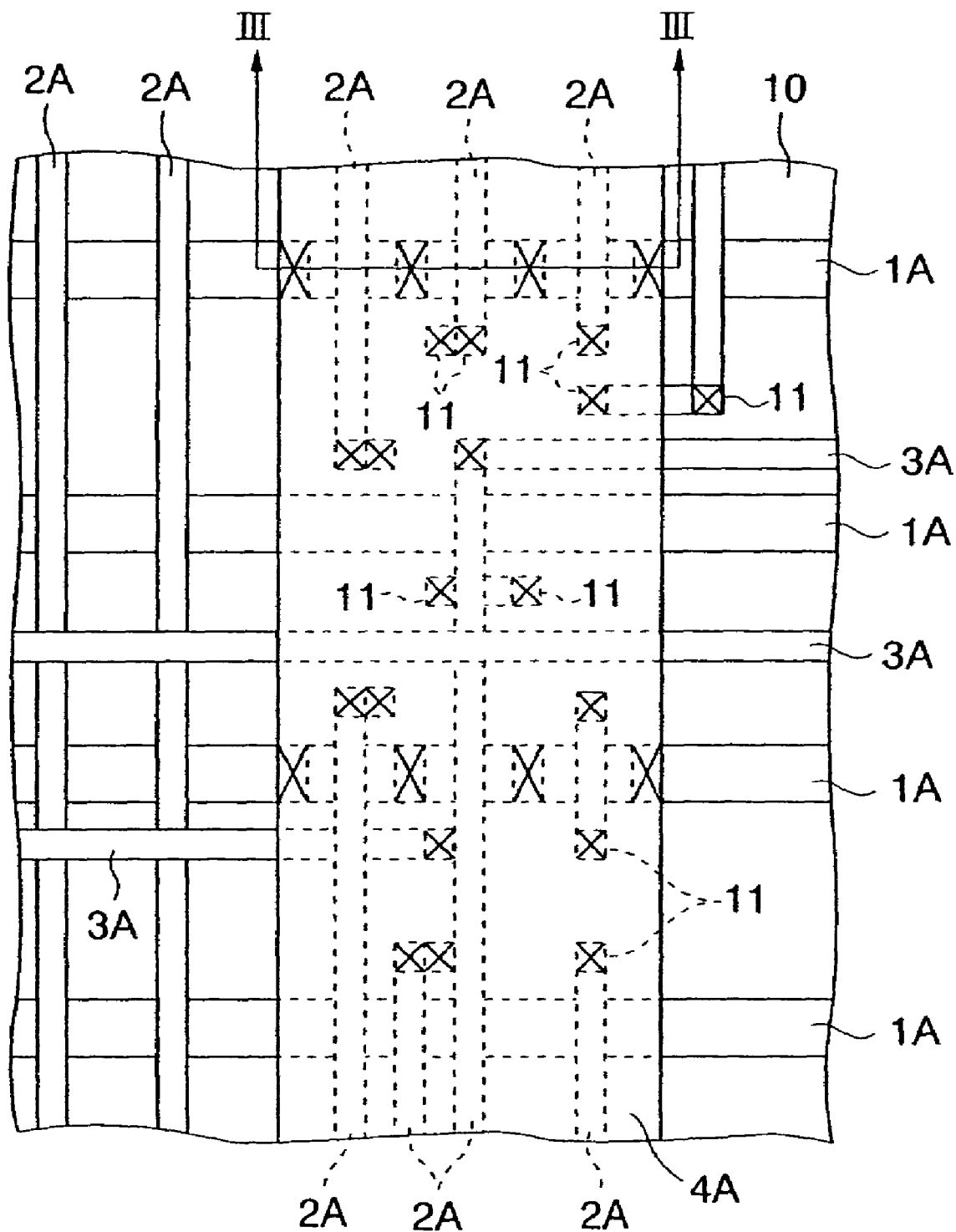
FIG. 4 is a plan view showing a wiring part of a semiconductor device according to an embodiment of the present invention.
Figure 5:
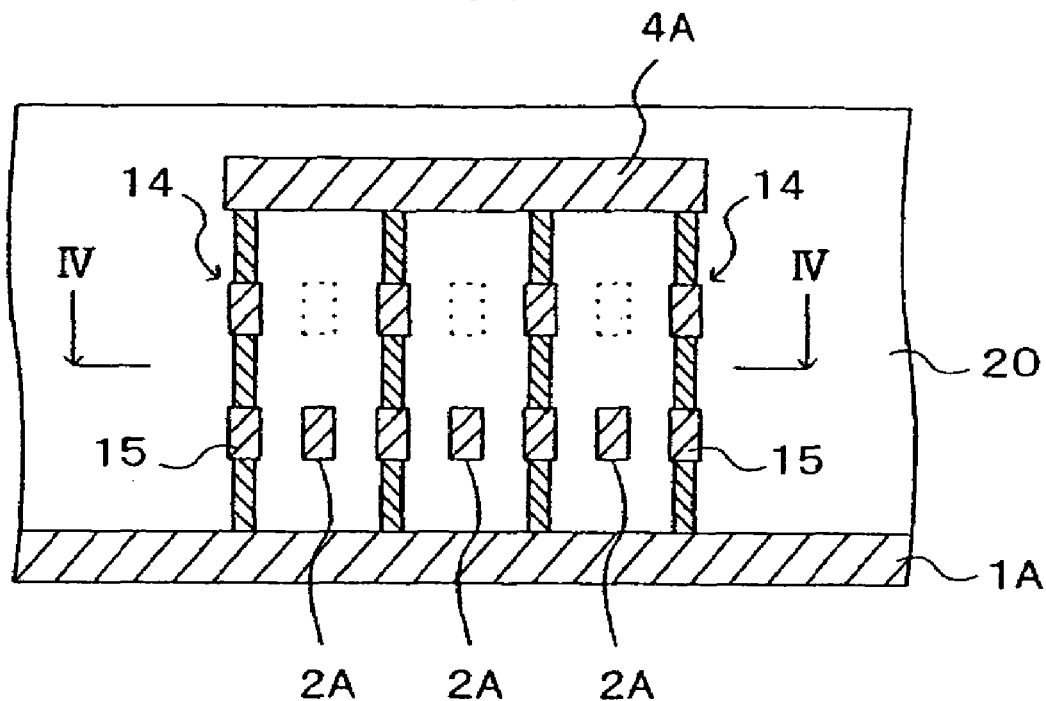
FIG. 5 is a longitudinal sectional view taken along a line III-III of FIG. 4.
Figure 6:
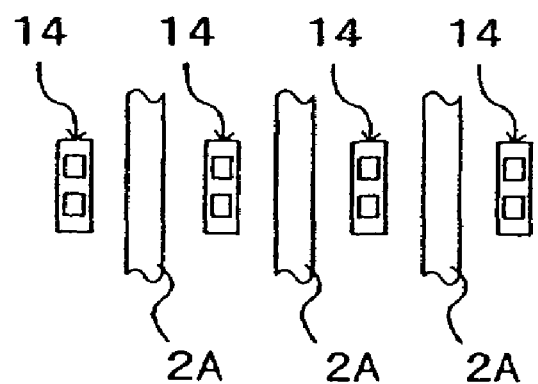
FIG. 6 is a transverse sectional view taken along a line IV-IV of FIG. 5.

FIG. 4 is a plan view showing a wiring part of a semiconductor device according to the embodiment of the present invention, FIG. 5 is a longitudinal sectional view taken along a line III-III of FIG. 4, and FIG. 6 is a transverse sectional view taken along a line IV-IV of FIG. 5. Note that illustration of an insulating layer and a semiconductor substrate below and under wiring 1A is omitted in FIG. 5.

FIG. 4 shows four wiring layers stacked on a semiconductor substrate 10 having specified elements (cells) formed thereon with an insulating layer interposed thereamong. Note that, though FIG. 4 shows only the four wiring layers, other wiring layers may be formed above or below these wiring layers.

In this embodiment, these four wiring layers are referred to as a first wiring layer, a second wiring layer, a third wiring layer and a fourth wiring layer in order from a wiring layer closer to the semiconductor substrate 10. Moreover, the second wiring layer and the third wiring layer are referred to as intermediate wiring layers.

In the first and third wiring layers, wirings 1A and 3A running mainly in a horizontal direction (X direction) are formed, and in the second and fourth wiring layers, wirings 2A and 4A running mainly in a vertical direction (Y direction) are formed. Widths and wiring intervals of the wirings 1A, 2A, 3A and 4A are decided according to design rules.

Moreover, the design rules are determined by limitations on a fabrication process, electrical specifications required for the semiconductor device and the like.

Wirings in the different wiring layers are electrically connected via vias 11 penetrating through the insulating layer provided among the wiring layers. A size of the vias 11 is also decided according to the design rules. Note that the vias 11 are divided into the ones for connecting wirings to each other and the ones for connecting the elements (cells) formed on the semiconductor substrate 10 and the wirings.

For example, in the case of a narrow-width wiring such as a signal line through which only a relatively small current flows, such a wiring is connected to another wiring via one via 11. In the case of electric connection through a plurality of wiring layers, stack vias are used. A broad-width wiring such as a power supply line through which a relatively large current flows is connected to another wiring via a plurality of stack vias. In the case of connecting broad-width wirings in wiring layers separated from each other by another or more layers interposed therebetween, the positions of the stack vias are determined by a designing method to be described later, and between the stack vias, provided are spaces through which the wirings of the intermediate wiring layers can be passed.

Figure 7:
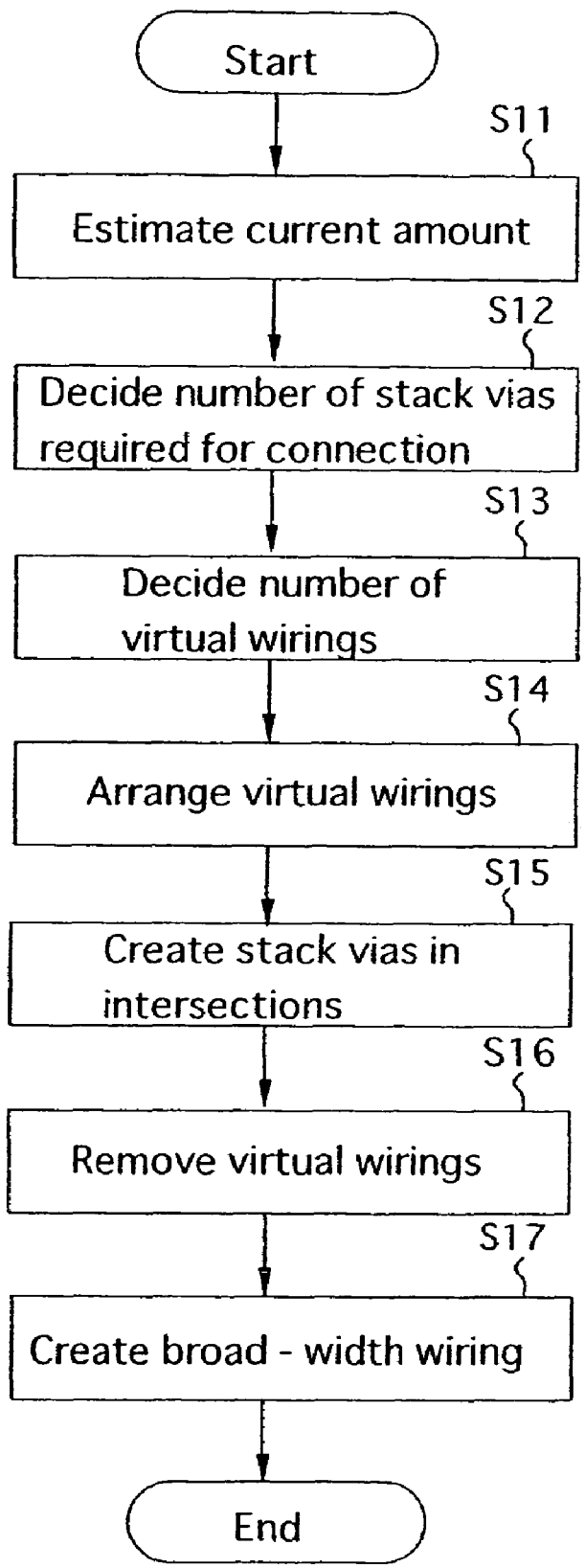
FIG. 7 is a flowchart showing a method for designing a wiring connecting section according to the embodiment of the present invention.

Hereinafter, description will be made for a method for designing a connecting section between the wiring 4A and the wiring 1A in a position of the line III-III of FIG. 4 with reference to the flowchart shown in FIG. 7 and the schematic views shown in FIGS. 8A to 8D.

First, in the case of designing the connecting section of the wiring 1A and the wiring 4A, an amount of a current flowing through these two wirings 1A and 4A is estimated (step S11) according to specifications for the elements formed on the semiconductor substrate 10. Here, the maximum value of the amount of the current flowing from the wiring 4A to the wiring 1A, which is also referred to as an allowable current value, is set as $I_L$.

Next, the number of stack vias required for connecting the wiring 1A and the wiring 4A is determined (step S12). If the maximum current amount (allowable current value) per one stack via, which is determined by the design rules, is set as $I_{VIA}$, then the number of stack vias required for connecting the wiring 1A and the wiring 4A is obtained by the following equation (1).

$$n = I_L / I_{VIA} \quad (1)$$

Note that, in the equation (1), decimals are rounded up to a whole number.

A structure of the stack via (size of the via, size of a pad between the via and the via, interval between the stack vias and the like) is determined by a library of the CAD tool, which is prepared based on the design rules. Moreover, the number m of stack vias arrayed in a width direction of the wiring according to the width of the wiring is also determined by the design rules.

Thereafter, the number x of virtual wirings used for deciding the positions of the vias is determined by the following equation (2) (step S13).

$$x = n / m \quad (2)$$

Note that, in the equation (2), decimals are rounded up to a whole number.

Next, the virtual wirings are arranged in a region where the wiring 4A above the wiring 1A is formed (step S14). In this embodiment, the width of the virtual wirings is set equal to the width of the stack vias. However, the present invention is not limited to this, and the width of the virtual wirings may be any width enough for the stack vias determined by the design rules to be arranged thereon.

Figure 8A:
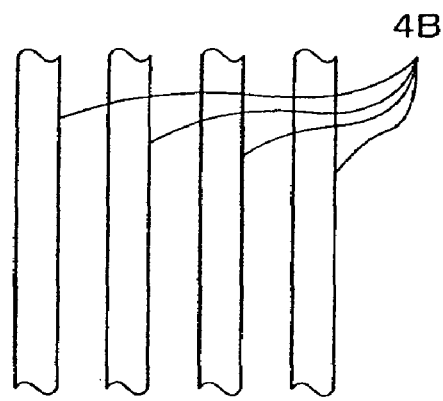
FIGS. 8A to 8D are schematic views showing the method for designing a wiring connecting section according to the embodiment of the present invention.

Moreover, if the virtual wirings are located within the region where the wiring 4A is formed, then the intervals among the virtual wirings may be made even. Alternatively, the virtual wirings may be arranged in the vicinity of both ends of the wiring 4A in the width direction at the minimum interval determined by the design rules to make a large space in the center thereof. Here, as shown in FIG. 8A, assumption is made that the number of virtual wirings 4B is four as a result of the calculation in the equation (2), and that these virtual wirings 4B are arranged at an even interval in the region where the wiring 4A above the wiring 1A is formed.

Figure 8B:
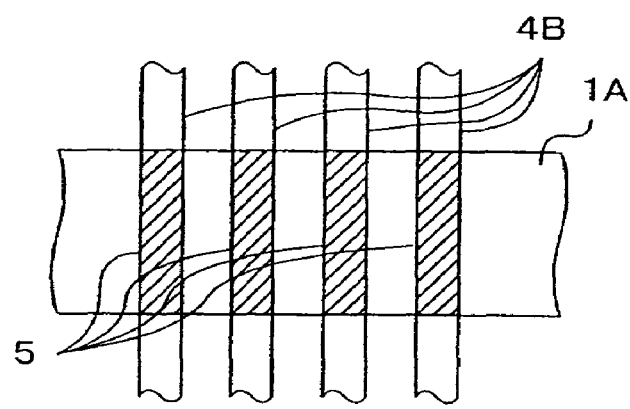

Next, stack vias 14 are created in spots where the virtual wirings 4B and the wiring 1A cross with each other (step S15). In FIG. 8B, intersections 5 of the virtual wirings 4B and the wiring 1A are shown by hatching. However, in actual cases, the stack vias 14 of the number according to the width of the wiring 1A are created as shown in FIG. 6. In this example, for one intersection (one of the intersections 5 of the virtual wirings 4B and the wiring 1A), the number of stack vias 14 arrayed in a direction where the wiring 1A extends is set as 2 (m=2).

Note that, as the stack vias 14 are created, in the intermediate wiring layers, pads 15 for connecting upper and lower vias are created. Unlike the conventional ones, each pad 15 is not created over the entire intersection of the wiring 4A and the wiring 1A, but each pad 15 is created for each intersection of the virtual wirings 4B and the wiring 1A.

Figure 8C:
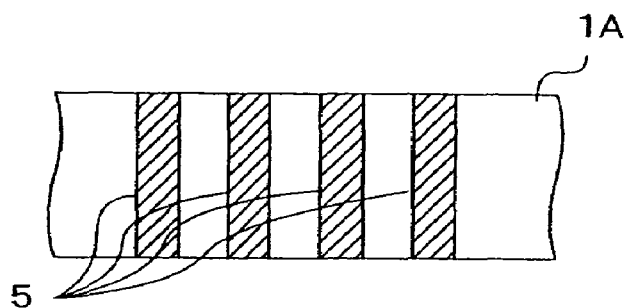
Figure 8D:
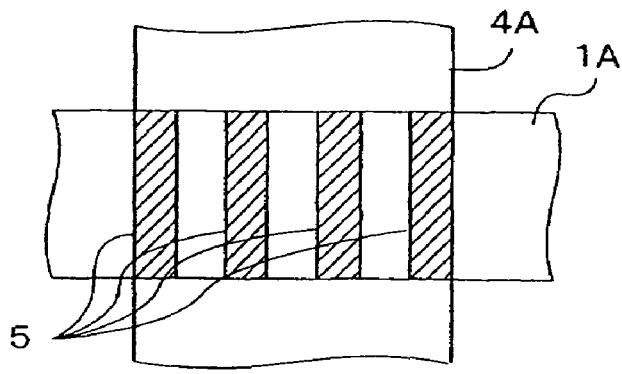

When the number and the positions of the stack vias 14 are decided as described above, the virtual wirings 4B are deleted as shown in FIG. 8C (step S16). Subsequently, as shown in FIG. 8D, the broad-width wiring 4A is created in a specified position (step S17).

After the design for the connecting section between the wiring 1A and the wiring 4A is completed, wirings passing between the stack vias 14 as well as between the pads 15 are created in the intermediate wiring layers according to needs. In FIGS. 5 and 6, the wirings 2A of the second wiring layer are formed in regions between the stack vias 14 (pads 15).

According to this embodiment, the number of stack vias is determined based on the amount of the current flowing between the wirings; therefore, the electrical specifications required for the wiring connecting sections can be satisfied. Moreover, provided are a necessary and sufficient number of stack vias in the connecting sections between the broad-width wirings, and the spaces allowing the other wirings to be passed therethrough are provided within the regions of the wiring connecting sections; therefore, a necessity of creating the wirings of the intermediate wiring layers so as to be detoured around the wiring connecting sections is eliminated. Thus, for example as shown in FIG. 4, the wiring patterns of the intermediate wiring layers are simplified, and the degree of freedom in designing the wirings is significantly enhanced as compared with the conventional one. Furthermore, such enhancement of the degree of freedom in designing the wirings brings about an effect that cost reduction due to reduction of the number of wiring layers and much higher integration of the semiconductor device are enabled.

What is claimed is:

1. A method for designing a wiring connecting section of a first wiring and a second wiring formed in mutually different wiring layers above a semiconductor substrate, said method comprising:

a stack via number determination step for determining the number of stack vias required for connecting said first wiring and said second wiring based on an amount of a current flowing between said first wiring and said second wiring;

a virtual wiring number determination step for determining the number of virtual wirings based on the number of said stack vias;

a virtual wiring arrangement step for arranging a plurality of said virtual wirings in a forming region of said second wiring above said first wiring;

a stack via creation step for creating a plurality of said stack vias in portions where said first wiring and said plurality of virtual wirings cross with each other;

a virtual wiring deletion step for deleting said virtual wirings; and a second wiring creation step for creating said second wiring.

2. A method for designing a wiring connecting section according to claim 1, wherein pads are created in positions between said first wiring and said second wiring, said positions corresponding to said plurality of stack vias.

3. A method for designing a wiring connecting section according to claim 1, wherein a third wiring passing among said plurality of stack vias is created.

4. A method for designing a wiring connecting section according to claim 1, wherein said virtual wirings are arranged uniformly at a constant interval in the forming region of said second wiring.

* * * * *